(12) United States Patent
Thill

(10) Patent No.: US 10,601,124 B1
(45) Date of Patent: *Mar. 24, 2020

(54) ANTENNA ASSEMBLY FOR A VEHICLE

(71) Applicant: Airgain Incorporated, San Diego, CA (US)

(72) Inventor: Kevin Thill, Scottsdale, AZ (US)

(73) Assignee: Airgain Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/414,717

(22) Filed: May 16, 2019

Related U.S. Application Data

(63) Continuation of application No. 16/237,678, filed on Jan. 1, 2019.

(51) Int. Cl.
| | |
|---|---|
| H01Q 1/32 | (2006.01) |
| H05K 1/02 | (2006.01) |
| H01Q 1/02 | (2006.01) |
| H01Q 1/22 | (2006.01) |
| H01Q 1/24 | (2006.01) |

(52) U.S. Cl.
CPC ............. *H01Q 1/3275* (2013.01); *H01Q 1/02* (2013.01); *H01Q 1/2291* (2013.01); *H01Q 1/241* (2013.01); *H05K 1/0203* (2013.01); *H05K 1/0216* (2013.01)

(58) Field of Classification Search
CPC ........ H01Q 1/243; H01Q 1/02; H01Q 1/3275; H01Q 1/2291; H01Q 1/3291; H01Q 1/241; H05K 1/0203; H05K 1/0216; H05K 2201/10371

See application file for complete search history.

(56) References Cited

U.S. PATENT DOCUMENTS

| | | |
|---|---|---|
| D418,142 S | 12/1999 | Thill |
| 6,087,990 A | 7/2000 | Thill et al. |
| 6,850,191 B1 | 2/2005 | Thill et al. |
| 7,061,437 B2 | 6/2006 | Lin et al. |
| 7,148,849 B2 | 12/2006 | Lin |
| 7,215,296 B2 | 5/2007 | Abramov et al. |
| D546,821 S | 7/2007 | Oliver |
| D549,696 S | 8/2007 | Oshima et al. |
| 7,333,067 B2 | 2/2008 | Hung et al. |
| 7,336,959 B2 | 2/2008 | Khitrik et al. |
| D573,589 S | 7/2008 | Montgomery et al. |
| 7,405,704 B1 | 8/2008 | Lin et al. |
| 7,477,195 B2 | 1/2009 | Vance |
| D592,195 S | 5/2009 | Wu et al. |
| 7,570,215 B2 | 8/2009 | Abramov et al. |
| D599,334 S | 9/2009 | Chiang |
| D606,053 S | 12/2009 | Wu et al. |
| D607,442 S | 1/2010 | Su et al. |
| D608,769 S | 1/2010 | Bufe |

(Continued)

*Primary Examiner* — James Wu
(74) *Attorney, Agent, or Firm* — Clause Eight IPS; Michael Catania

(57) ABSTRACT

An antenna assembly comprising a base, a modem, a top lid and a housing is disclosed herein. The antenna assembly is for a vehicle. The base is composed of an aluminum material. The modem is disposed within the base. The top lid is for the base, and the top lid comprises at least one antenna element disposed on an exterior surface thereof. The housing covers the top lid and base. The top lid and base act as an electro-magnetic barrier for the modem.

18 Claims, 5 Drawing Sheets

FIG. 3

(56) References Cited

U.S. PATENT DOCUMENTS

| | | |
|---|---|---|
| D612,368 S | 3/2010 | Yang et al. |
| 7,705,783 B2 | 4/2010 | Rao et al. |
| 7,729,662 B2 | 6/2010 | Abramov et al. |
| D621,819 S | 8/2010 | Tsai et al. |
| 7,843,390 B2 | 11/2010 | Liu |
| D633,483 S | 3/2011 | Su et al. |
| D635,127 S | 3/2011 | Tsai et al. |
| 7,907,971 B2 | 3/2011 | Salo et al. |
| D635,560 S | 4/2011 | Tsai et al. |
| D635,963 S | 4/2011 | Podduturi |
| D635,964 S | 4/2011 | Podduturi |
| D635,965 S | 4/2011 | Mi et al. |
| D636,382 S | 4/2011 | Podduturi |
| 7,965,242 B2 | 6/2011 | Abramov et al. |
| D649,962 S | 12/2011 | Tseng et al. |
| D651,198 S | 12/2011 | Mi et al. |
| D654,059 S | 2/2012 | Mi et al. |
| D654,060 S | 2/2012 | Ko et al. |
| D658,639 S | 5/2012 | Huang et al. |
| D659,129 S | 5/2012 | Mi et al. |
| D659,685 S | 5/2012 | Huang et al. |
| D659,688 S | 5/2012 | Huang et al. |
| 8,175,036 B2 | 5/2012 | Visuri et al. |
| 8,184,601 B2 | 5/2012 | Abramov et al. |
| D662,916 S | 7/2012 | Huang et al. |
| 8,248,970 B2 | 8/2012 | Abramov et al. |
| D671,097 S | 11/2012 | Mi et al. |
| 8,310,402 B2 | 11/2012 | Yang |
| D676,429 S | 2/2013 | Gosalia et al. |
| D678,255 S | 3/2013 | Ko et al. |
| 8,423,084 B2 | 4/2013 | Abramov et al. |
| D684,565 S | 6/2013 | Wei |
| D685,352 S | 7/2013 | Wei |
| D685,772 S | 7/2013 | Zheng et al. |
| D686,600 S | 7/2013 | Yang |
| D689,474 S | 9/2013 | Yang et al. |
| D692,870 S | 11/2013 | He |
| D694,738 S | 12/2013 | Yang |
| D695,279 S | 12/2013 | Yang et al. |
| D695,280 S | 12/2013 | Yang et al. |
| 8,654,030 B1 | 2/2014 | Mercer |
| 8,669,903 B2 | 3/2014 | Thill et al. |
| D703,195 S | 4/2014 | Zheng |
| D703,196 S | 4/2014 | Zheng |
| D706,247 S | 6/2014 | Zheng et al. |
| D706,750 S | 6/2014 | Bringuir |
| D706,751 S | 6/2014 | Chang et al. |
| D708,602 S | 7/2014 | Gosalia et al. |
| D709,053 S | 7/2014 | Chang et al. |
| D710,832 S | 8/2014 | Yang |
| D710,833 S | 8/2014 | Zheng et al. |
| 8,854,265 B1 | 10/2014 | Yang et al. |
| D716,775 S | 11/2014 | Bidermann |
| 9,432,070 B2 | 8/2016 | Mercer |
| 9,912,043 B1 | 3/2018 | Yang |
| D823,285 S | 7/2018 | Montgomery |
| D832,241 S | 10/2018 | He et al. |
| 10,109,918 B2 | 10/2018 | Thill |
| 10,164,324 B1 | 12/2018 | He et al. |
| 2002/0003499 A1 | 1/2002 | Kouam et al. |
| 2002/0156576 A1* | 10/2002 | Annett ............... G01C 21/26 701/468 |
| 2004/0222936 A1 | 11/2004 | Hung et al. |
| 2005/0073462 A1 | 4/2005 | Lin et al. |
| 2005/0190108 A1 | 9/2005 | Lin et al. |
| 2006/0208900 A1 | 9/2006 | Tavassoli Hozouri |
| 2007/0030203 A1 | 2/2007 | Tsai et al. |
| 2008/0150829 A1 | 6/2008 | Lin et al. |
| 2009/0002244 A1 | 1/2009 | Woo |
| 2009/0058739 A1 | 3/2009 | Konishi |
| 2009/0135072 A1 | 5/2009 | Ke et al. |
| 2009/0231186 A1* | 9/2009 | Barak ............... H01Q 1/3275 342/352 |
| 2009/0262028 A1 | 10/2009 | Murnbru et al. |
| 2010/0188297 A1 | 7/2010 | Chen et al. |
| 2010/0283684 A1* | 11/2010 | Rabinovich ......... H01Q 1/3275 343/700 MS |
| 2010/0309067 A1 | 12/2010 | Tsou et al. |
| 2011/0006950 A1 | 1/2011 | Park et al. |
| 2012/0038514 A1 | 2/2012 | Bang |
| 2012/0229348 A1 | 9/2012 | Chiang |
| 2012/0242546 A1 | 9/2012 | Hu et al. |
| 2017/0054204 A1 | 2/2017 | Changalvala et al. |
| 2017/0317409 A1* | 11/2017 | Ayatollahi ............. H01Q 9/42 |

\* cited by examiner

ANTENNA ASSEMBLY FOR A VEHICLE

CROSS REFERENCE TO RELATED APPLICATION

The Present Application is a continuation application of U.S. patent application Ser. No. 16/237,678, filed on Jan. 1, 2019, which is hereby incorporated by reference in its entirety.

STATEMENT REGARDING FEDERALLY SPONSORED RESEARCH OR DEVELOPMENT

Not Applicable

BACKGROUND OF THE INVENTION

Field of the Invention

This invention relates to antenna assemblies for vehicles.

Description of the Related Art

In wireless communication systems for vehicles, a modem for the vehicle is typically placed a great distance away from an antenna in order to prevent electro-magnetic signals from the modem from interfering with the antenna. This often requires a long coaxial cable wired throughout the vehicle.

General definitions for terms utilized in the pertinent art are set forth below.

BLUETOOTH technology is a standard short range radio link that operates in the unlicensed 2.4 gigahertz band.

Code Division Multiple Access ("CDMA") is a spread spectrum communication system used in second generation and third generation cellular networks, and is described in U.S. Pat. No. 4,901,307.

GSM, Global System for Mobile Communications is a second generation digital cellular network.

The Universal Mobile Telecommunications System ("UMTS") is a wireless standard.

Long Term Evolution ("LTE") is a standard for wireless communication of high-speed data for mobile phones and data terminals and is based on the GSM/EDGE and UMTS/HSPA communication network technologies.

LTE Frequency Bands include 698-798 MHz (Band 12, 13, 14, 17); 791-960 MHz (Band 5, 6, 8, 18, 19, 20); 1710-2170 MHz (Band 1, 2, 3, 4, 9, 10, 23, 25, 33, 34, 35, 36, 37, 39); 1427-1660.5 MH (Band 11, 21, 24); 2300-2700 MHz (Band 7, 38, 40, 41); 3400-3800 MHz (Band 22, 42, 43).

Antenna impedance and the quality of the impedance match are most commonly characterized by either return loss or Voltage Standing Wave Ratio.

Surface Mount Technology ("SMT") is a process for manufacturing electronic circuits wherein the components are mounted or placed directly onto a surface of a printed circuit board ("PCB").

The APPLE IPHONE® 5 LTE Bands include: LTE700/1700/2100 (698-806 MHz/1710-1785 MHz/1920-2170 MHz); LTE 850/1800/2100 (824-894 MHz/1710-1880 MHz/1920-2170 MHz); and LTE 700/850/1800/1900/2100 (698-806 MHz/824-894 MHz/1710-1880 MHz/1850-1990 MHz/1920/2170).

The SAMSUNG GALAXY® SIII LTE Bands include: LTE 800/1800/2600 (806-869 MHz/1710-1880 MHz/2496-2690 MHz.

The NOKIA LUMIA® 920 LTE Bands: LTE 700/1700/2100 (698-806 MHz/1710-1785 MHz/1920-2170 MHz); LTE 800/900/1800/2100/2600 (806-869 MHz/880-960 MHz/1710-1880 MHz/1920-2170 MHz/2496-2690 MHz).

The long coaxial cable that connects a modem to an antenna on a vehicle leads to signal losses due to the length of the coaxial cable. Thus, there is a need for placement of a modem in proximity of an antenna for a vehicle system.

BRIEF SUMMARY OF THE INVENTION

One aspect of the present invention is an antenna assembly comprising a base, a modem, a top lid and a housing. The base is composed of an aluminum material. The modem is disposed on the base. The top lid is for the base, and the top lid comprises at least one antenna element disposed on an exterior surface. The housing covers the top lid and base. The top lid acts as an electro-magnetic barrier for the modem.

Another aspect of the present invention is a wireless communication assembly for a vehicle comprising a base, a modem, a top lid and a housing. The base is composed of an aluminum material and attached to the vehicle. The modem is disposed on the base. The top lid is for the base, and the top lid comprises at least one antenna element disposed on an exterior surface. The housing covers the top lid and base. The top lid acts as an electro-magnetic barrier for the modem.

Having briefly described the present invention, the above and further objects, features and advantages thereof will be recognized by those skilled in the pertinent art from the following detailed description of the invention when taken in conjunction with the accompanying drawings.

DETAILED DESCRIPTION OF THE INVENTION

Figure 1:
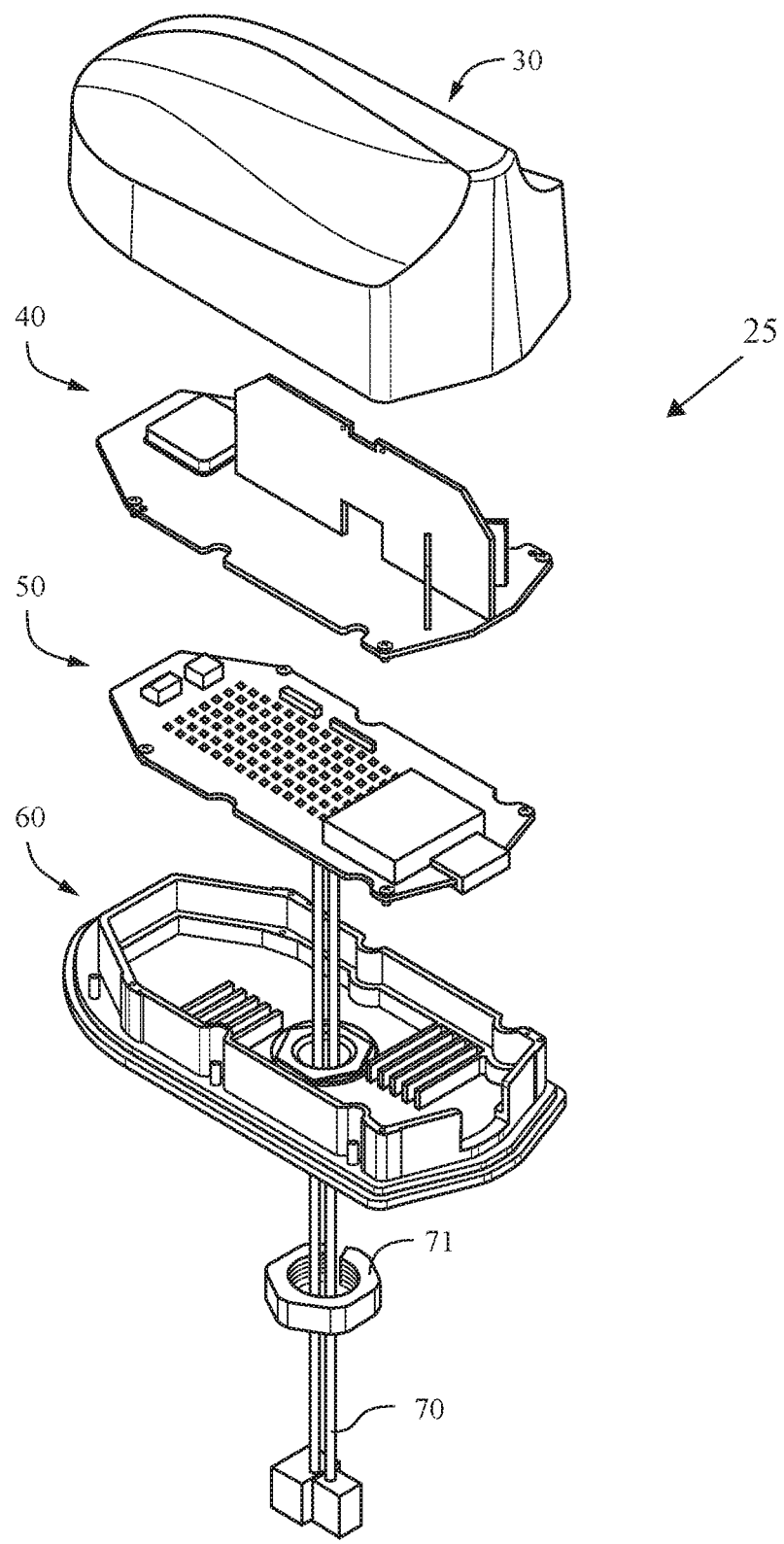
FIG. 1 is an exploded view of an antenna assembly for a vehicle.

An antenna assembly 25 is shown in FIG. 1. The antenna assembly preferably comprises a base 60, a modem 50, a top lid 40 and a housing 30. The base 60 is preferably composed of an aluminum material. The modem 50 is disposed on the base 60. The top lid 40 is to cover the base 60 and modem 50, and the top lid 40 preferably comprises at least one antenna element disposed on an exterior surface. A radiofrequency cable 70 is attached to the modem 50 and secured to the base 60 by bolt 71. The housing 30 covers the top lid 40 and the base 60. The top lid 40 acts as an electromagnetic barrier for the modem 50 to maintain the electromagnetic signals inside of the base 60 to prevent interference with the antenna signals.

Figure 2:
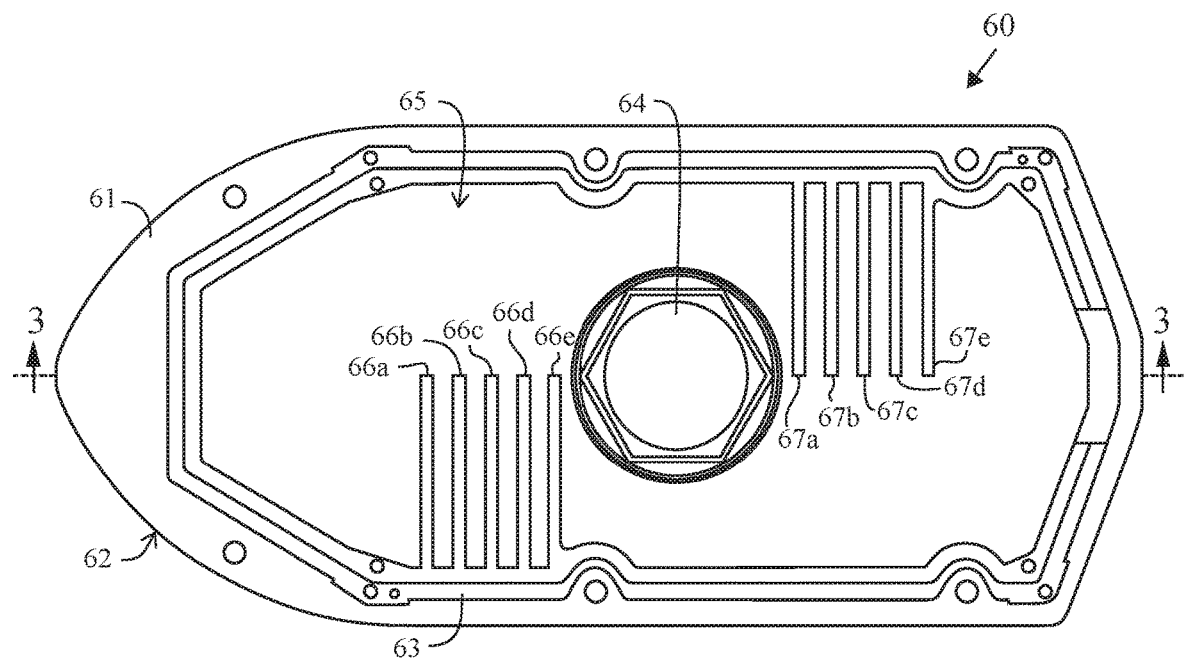
FIG. 2 is a top plan view of a base portion of an antenna assembly for a vehicle.
Figure 3:
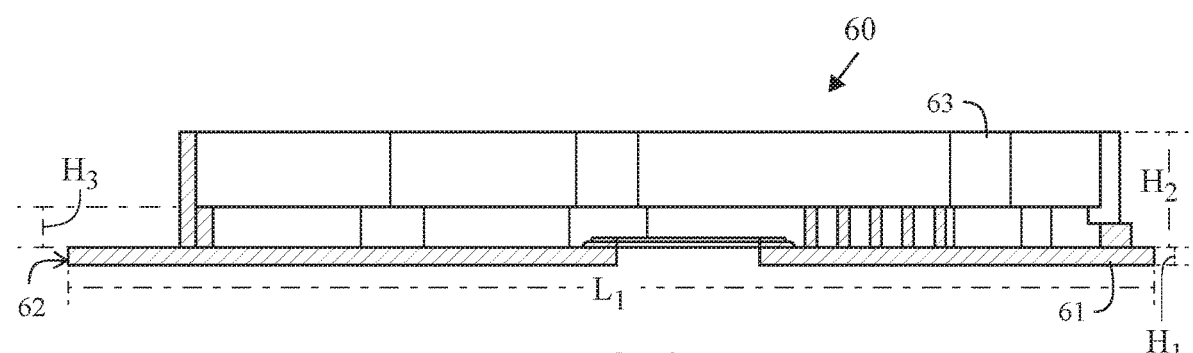
FIG. 3 is a side elevation of the base portion of FIG. 2.

As shown in FIGS. 2 and 3, the base 60 includes a body 61 with an interior surface 62. A side wall 63 defines an interior compartment 65 in which a first plurality of heat dissipation elements 66a-66e and a second plurality of heat dissipation elements 67a-67e. An aperture 64 extends through the body 61 for access by at least one cable. The base 60 is preferably composed of a die-cast aluminum material to prevent electro-magnetic signals from the modem 50 from interfering with the antennas on the top lid 40. In this manner, the modem 50 is capable of being placed in proximity to the antennas on the top lid 50 without interference from electro-magnetic signals with the antennas on the top lid 40.

The first plurality of heat dissipation elements 66a-66e and the second plurality of heat dissipation elements 67a-67e dissipate heat that is generate by the operation of the modem 50.

The sidewall 63, in addition to acting as electro-magnetic barrier, also provides a structure for placement of the top lid 40 thereon.

As shown in FIG. 3, the base 60 preferably has a height H2 ranging from 0.5 inch to 1.0 inch, a height, H1, ranging from 0.05 inch to 0.15 inch, and a height, H3, ranging from 0.15 inch to 0.30 inch The base preferably has a width ranging from 2.5 inches to 3.5 inches, and a length, L1, ranging from 6.0 inches to 8.0 inches. The aperture 64 is preferably from 1.0 inch to 1.25 inches across.

Figure 7:
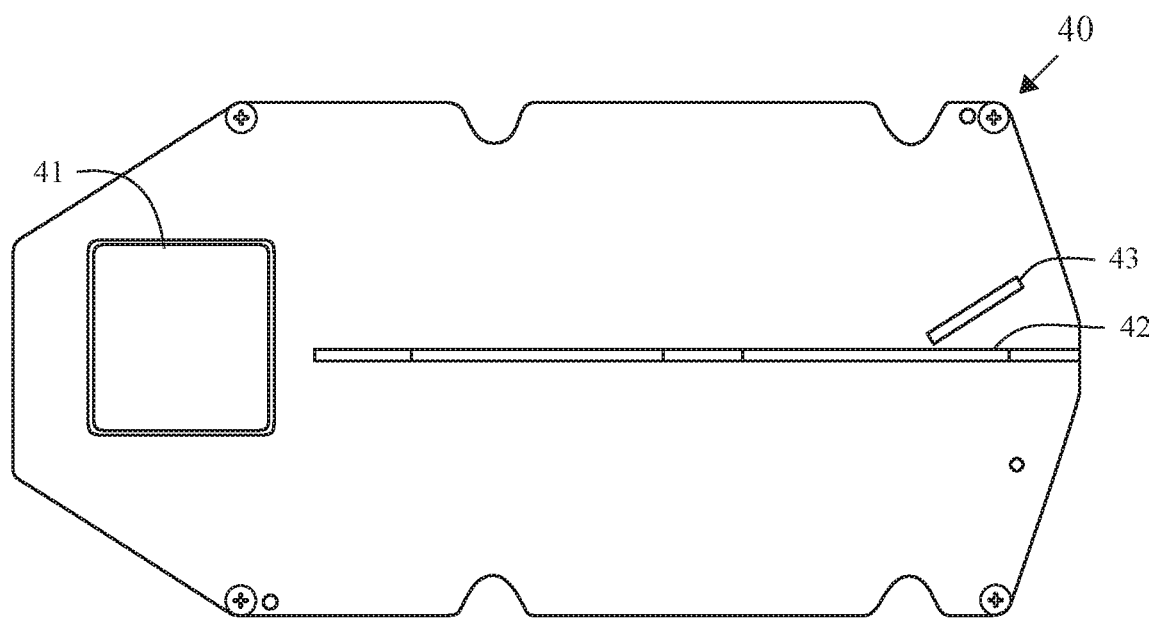
FIG. 7 is a top plan view of a top lid for an antenna assembly for a vehicle.
Figure 8:
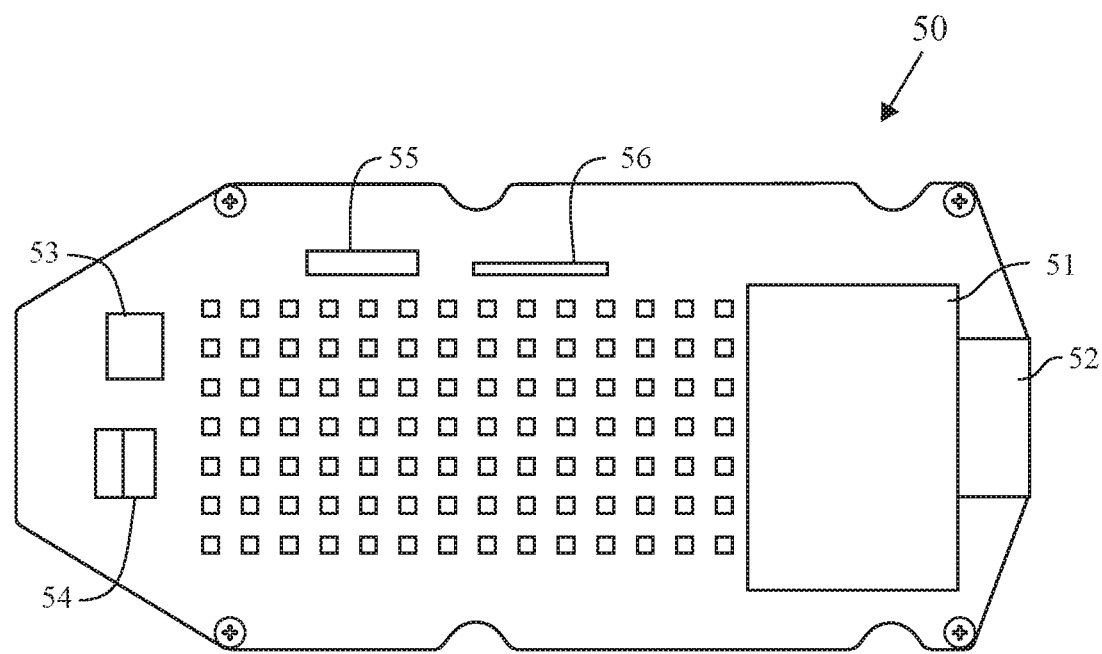
FIG. 8 is a top plan view of a modem for an antenna assembly for a vehicle.

As shown in FIG. 7, the top lid 40 comprises a first antenna element 42, a second antenna element 43 and a third antenna element 41. Preferably the first antenna element 42 is a multi-band antenna for cellular communications such as disclosed in Thill, U.S. patent Ser. No. 10/109,918 for a Multi Element Antenna For Multiple bands Of Operation And Method Therefor, which is hereby incorporated by reference in its entirety. Alternatively, the first antenna element 42 is a multi-band antenna for cellular communications such as disclosed in He, U.S. Pat. No. 9,362,621 for a Multi Band LTE Antenna, which is hereby incorporated by reference in its entirety.

Preferably, the second antenna element 43 is selected from the group of antennas consisting of a WiFi 2G antenna, a WiFi 5G antenna, a DECT antenna, a ZigBee antenna and a Zwave antenna. The WiFi 2G antennas are preferably 2400-2690 MegaHertz. The WiFi 5G antenna is preferably a 5.8 GigaHertz antenna. Alternatively, the second antenna element 43 operates at 5.15 GHz or at 5.85 GHz. Other possible frequencies for the second antenna element 43 include 5150 MHz, 5200 MHz, 5300 MHz, 5400 MHz, 5500 MHz, 5600 MHz, 5700 MHz, 5850 MHz, and 2.4 GHz. The second antenna element 43 preferably operates on an 802.11 communication protocol. Most preferably, the second antenna element 43 operates on an 802.11n communication protocol. Alternatively, the second antenna element 43 operates on an 802.11b communication protocol. Alternatively, the second antenna element 43 operates on an 802.11g communication protocol. Alternatively, the second antenna element 43 operates on an 802.11a communication protocol. Alternatively, the second antenna element 43 operates on an 802.11ac communication protocol.

The third antenna element 41 is preferably a GPS/GLONASS ("Global Positioning Satellite/Global Navigation Satellite System") module.

Those skilled in the pertinent art will recognize that other antenna types may be used for the first antenna element 42, the second antenna element 43 and/or the third antenna element 41 without departing from the scope and spirit of the present invention.

The top lid 40 is preferably composed of an aluminum material, at least on a bottom surface. Alternatively, the top lid 40 is composed of materials that can act as a barrier to electro-magnetic signals.

The modem 50 preferably includes at least one of a computation component, a communication chip 55, a switch, an antenna switch circuit, a GNSS ("Global Navigation Satellite System") reception component 56, a security access module 53, a mobile phone communication component 54, and a power supply source. The computation component preferably includes a CPU ("Central Processing Unit") 51, a memory 52, and an interface (I/F) component. The modem 50 preferably operates for vehicle to everything (V2X) communications, using a 802.11p communication protocol. Alternatively, the modem 50 operates Dedicated Short Range Communications (DSRC). Alternatively, the modem 50 operates cellular V2X (CV2X) using 5G technology.

Figure 4:
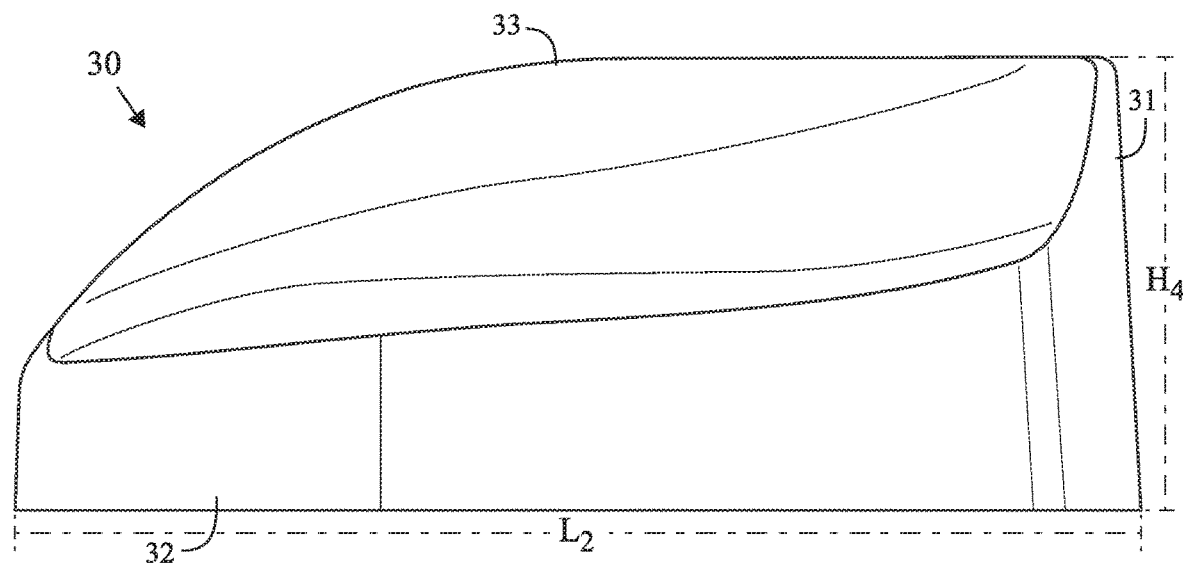
FIG. 4 is a side elevation view of a housing for an antenna assembly for a vehicle.
Figure 5:
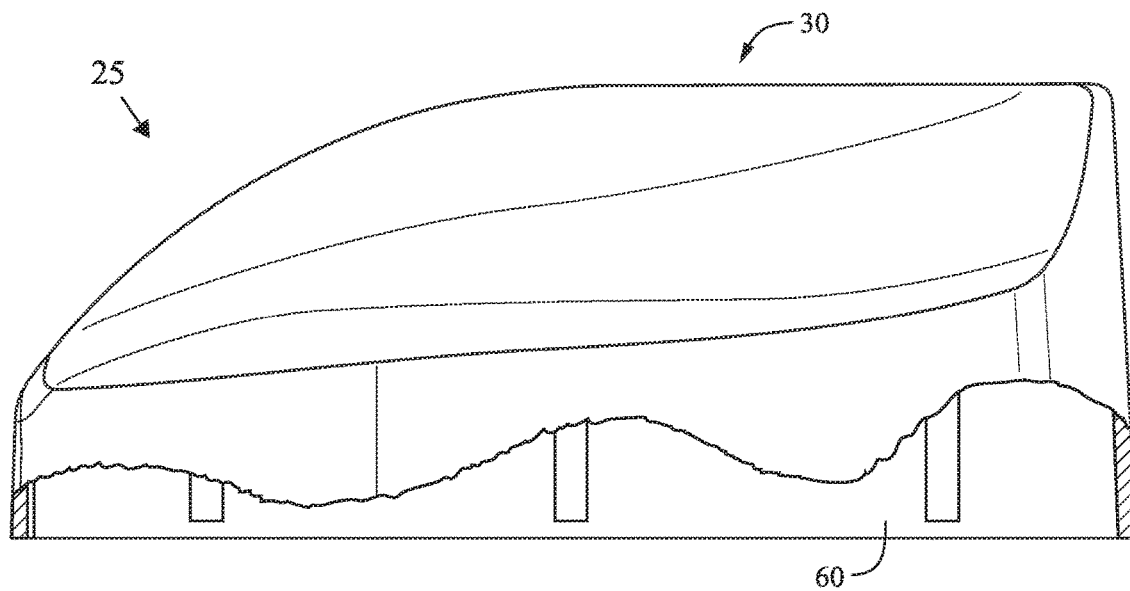
FIG. 5 is a side elevation view of an antenna assembly for a vehicle with a partial cut-away view.
Figure 6:
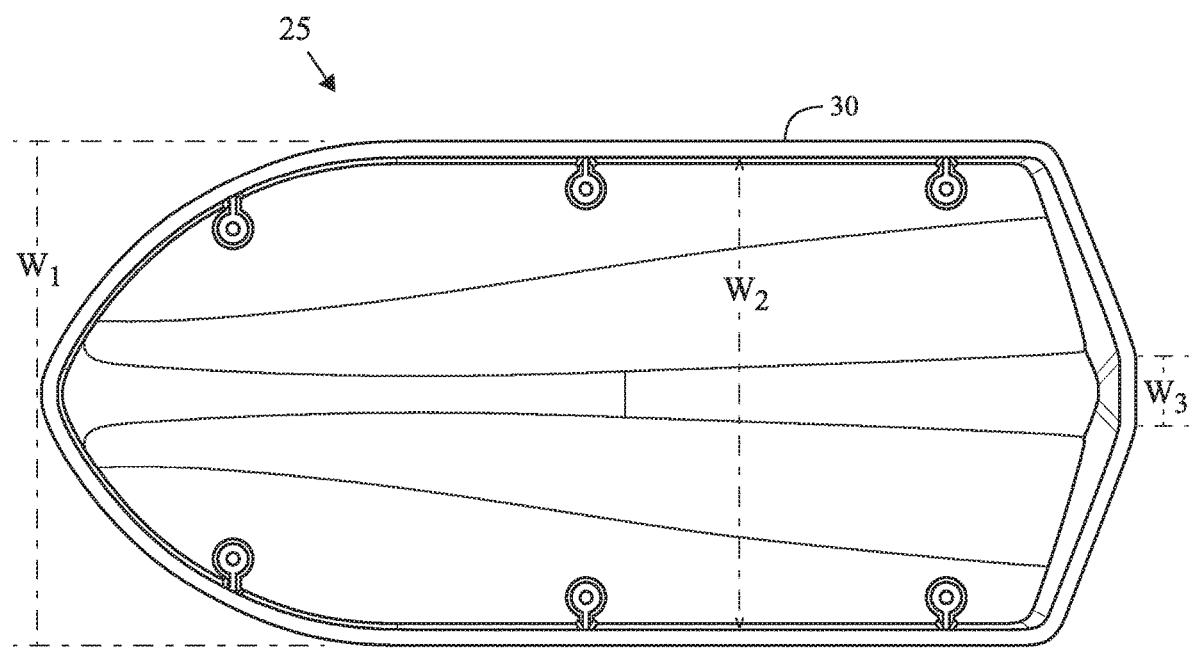
FIG. 6 is a top plan view of an antenna assembly for a vehicle.

Preferably, the housing 30 is composed of a polypropylene material. As shown in FIGS. 4, 5 and 6, the housing 30 preferably has a height, H4, ranging from 50 to 90 millimeters (mm), more preferably from 60 to 80 mm, and most preferably from 65 to 75 mm. The housing 30 preferably has a length, L2, ranging from 100 to 250 mm, more preferably from 150 to 200 mm, and most preferably from 160 to 190 mm. The housing 30 preferably has a width, W1 ranging from 50 to 100 mm, more preferably from 60 to 90 mm, and most preferably from 65 to 85 mm. An internal width W2 is preferably 70 to 80 mm. A width W3 is preferably 10 to 15 mm. The housing 30 has a sidewall 32, a crown 33 and a rear wall 31. The walls of the housing 30 preferably have a thickness ranging from 2 to 7 mm, and most preferably are 5 mm.

He, U.S. Pat. No. 9,362,621 for a Multi-Band LTE Antenna is hereby incorporated by reference in its entirety.

Abramov et al., U.S. Pat. No. 7,215,296 for a Switch Multi-Beam Antenna Serial is hereby incorporated by reference in its entirety.

Salo et al., U.S. Pat. No. 7,907,971 for an Optimized Directional Antenna System is hereby incorporated by reference in its entirety.

Abramov et al., U.S. Pat. No. 7,570,215 for an Antenna device with a controlled directional pattern and a planar directional antenna is hereby incorporated by reference in its entirety.

Abramov et al., U.S. Pat. No. 7,570,215 for an Antenna device with a controlled directional pattern and a planar directional antenna is hereby incorporated by reference in its entirety.

Abramov et al., U.S. Pat. No. 8,423,084 for a Method for radio communication in a wireless local area network and transceiving device is hereby incorporated by reference in its entirety.

Khitrik et al., U.S. Pat. No. 7,336,959 for an Information transmission method for a wireless local network is hereby incorporated by reference in its entirety.

Khitrik et al., U.S. Pat. No. 7,043,252 for an Information transmission method for a wireless local network is hereby incorporated by reference in its entirety.

Abramov et al., U.S. Pat. No. 8,184,601 for a METHOD FOR RADIO COMMUNICATION INA WIRELESS LOCAL AREA NETWORK WIRELESS LOCAL AREA NETWORK AND TRANSCEIVING DEVICE is hereby incorporated by reference in its entirety.

Abramov et al., U.S. Pat. No. 7,627,300 for a Dynamically optimized smart antenna system is hereby incorporated by reference in its entirety.

Abramov et al., U.S. Pat. No. 6,486,832 for a Direction-agile antenna system for wireless communications is hereby incorporated by reference in its entirety.

Yang, U.S. Pat. No. 8,081,123 for a COMPACT MULTI-LEVEL ANTENNA WITH PHASE SHIFT is hereby incorporated by reference in its entirety.

Nagaev et al., U.S. Pat. No. 7,292,201 for a Directional antenna system with multi-use elements is hereby incorporated by reference in its entirety.

Abramov et al., U.S. Pat. No. 7,696,948 for a Configurable directional antenna is hereby incorporated by reference in its entirety.

Abramov et al., U.S. Pat. No. 7,965,242 for a Dual-band antenna is hereby incorporated by reference in its entirety.

Abramov et al., U.S. Pat. No. 7,729,662 for a Radio communication method in a wireless local network is hereby incorporated by reference in its entirety.

Abramov et al., U.S. Pat. No. 8,248,970 for an OPTIMIZED DIRECTIONAL MIMO ANTENNA SYSTEM is hereby incorporated by reference in its entirety.

Visuri et al., U.S. Pat. No. 8,175,036 for a MULTIMEDIA WIRELESS DISTRIBUTION SYSTEMS AND METHODS is hereby incorporated by reference in its entirety.

Yang, U.S. Patent Publication Number 20110235755 for an MIMO Radio System With Antenna Signal Combiner is hereby incorporated by reference in its entirety.

Yang et al., U.S. Pat. No. 9,013,355 for an L SHAPED FEED AS PART OF A MATCHING NETWORK FOR A MICROSTRIP ANTENNA is hereby incorporated by reference in its entirety.

From the foregoing it is believed that those skilled in the pertinent art will recognize the meritorious advancement of this invention and will readily understand that while the present invention has been described in association with a preferred embodiment thereof, and other embodiments illustrated in the accompanying drawings, numerous changes modification and substitutions of equivalents may be made therein without departing from the spirit and scope of this invention which is intended to be unlimited by the foregoing except as may appear in the following appended claim. Therefore, the embodiments of the invention in which an exclusive property or privilege is claimed are defined in the following appended claims.

I claim as my invention the following:

1. An antenna assembly comprising:
    a base composed of an aluminum material, the base comprising a body, an interior surface, a sidewall and a plurality of heat dissipation elements extending from the interior surface;
    a modem disposed within the base and directly contacting the plurality of heat dissipation elements, the modem comprising at least one of a communication chip, a Global Navigation Satellite System reception component, a security access module, and a mobile phone communication component;
    a top lid for the base, the top lid comprising a bottom surface composed of an aluminum material and a multi-band antenna for cellular communications disposed on an exterior surface of the top lid; and
    a housing covering the top lid and the base;
    wherein the top lid and the base act as an electro-magnetic barrier for the modem allowing the modem to be placed in proximity to the multi-band antenna without interference from electro-magnetic signals from the multi-band antenna;
    wherein the plurality of heat dissipation elements dissipate heat generated by operation of the modem.

2. The antenna assembly according to claim 1 further comprising a radiofrequency cable connected to the modem.

3. The antenna assembly according to claim 1 wherein the base is composed of a die-cast aluminum material.

4. The antenna assembly according to claim 1 wherein the top lid comprises a base circuit board.

5. The antenna assembly according to claim 1 wherein the top lid comprises a cell circuit board.

6. The antenna assembly according to claim 1 wherein the top lid comprises a WiFi circuit board.

7. The antenna assembly according to claim 1 wherein the top lid comprises a Global Positioning Satellite/Global Navigation Satellite System module.

8. The antenna assembly according to claim 1 wherein the base has a width ranging from 2.5 inches to 3.5 inches, and a length ranging from 6.0 inches to 8.0 inches.

9. The antenna assembly according to claim 1 wherein the base has a height ranging from 0.5 inch to 1.0 inch.

10. A wireless communication assembly for a vehicle comprising:
    a base composed of an aluminum material for attached to the vehicle, the base comprising a body, an interior surface, a sidewall and a plurality of heat dissipation elements extending from the interior surface;
    a modem disposed within the base and directly contacting the plurality of heat dissipation elements, the modem comprising at least one of a communication chip, a Global Navigation Satellite System reception component, a security access module, and a mobile phone communication component;
    a top lid for the base, the top lid comprising a bottom surface composed of an aluminum material and a multi-band antenna for cellular communications disposed on an exterior surface of the top lid; and
    a housing covering the top lid and base;
    wherein the top lid and the base act as an electro-magnetic barrier for the modem allowing the modem to be placed in proximity to the multi-band antenna without interference from electro-magnetic signals from the multi-band antenna;
    wherein the plurality of heat dissipation elements dissipate heat generated by operation of the modem.

11. The wireless communication assembly according to claim 10 further comprising a radiofrequency cable connected to the modem.

12. The wireless communication assembly according to claim 10 wherein the base is composed of a die-cast aluminum material.

13. The wireless communication assembly according to claim 10 wherein the top lid comprises a base circuit board.

14. The wireless communication assembly according to claim 10 wherein the top lid comprises a cell circuit board.

15. The wireless communication assembly according to claim 10 wherein the top lid comprises a WiFi circuit board.

16. The wireless communication assembly according to claim 10 wherein the top lid comprises a Global Positioning Satellite/Global Navigation Satellite System module.

17. The wireless communication assembly according to claim 10 wherein the base has a width ranging from 2.5 inches to 3.5 inches, and a length ranging from 6.0 inches to 8.0 inches.

18. The wireless communication assembly according to claim 10 wherein the base has a height ranging from 0.5 inch to 1.0 inch.

* * * * *